United States Patent [19]

Kurafuji et al.

[11] 4,409,679
[45] Oct. 11, 1983

[54] STATIC MEMORY CIRCUIT

[75] Inventors: Setsuo Kurafuji, Yokohama; Kazuo Tanimoto, Tama, both of Japan

[73] Assignee: Fujitsu Limited, Kawasaki, Japan

[21] Appl. No.: 247,748

[22] Filed: Mar. 26, 1981

[30] Foreign Application Priority Data

Mar. 26, 1980 [JP] Japan .................................. 55-38537

[51] Int. Cl.³ ............................................. G11C 11/40
[52] U.S. Cl. .................................... 365/227; 365/190
[58] Field of Search .............................. 365/227, 190

[56] References Cited

U.S. PATENT DOCUMENTS 3,859,637  1/1975  Platt et al. ............................ 365/227
4,295,210  10/1981 Bexanger et al. .................... 365/227

OTHER PUBLICATIONS

IEEE International Solid-State Circuits Conference, "Random Access Memories" by Ohzowe et al., Feb. 15, 1980, pp. 236–237.

Primary Examiner—Terrell W. Fears
Attorney, Agent, or Firm—Staas & Halsey

[57] ABSTRACT

A static memory circuit incorporating memory cells of a MOS static type comprising a plurality of potential setting circuits for setting the ground side potential of one selected memory cell to be lower than those of other non-selected memory cells. Thus, reducing power dissipation by reducing current flowing through half-selected and non-selected memory cells without reducing read speed.

8 Claims, 5 Drawing Figures

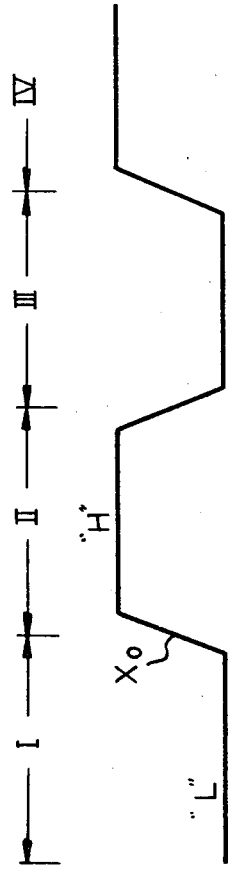
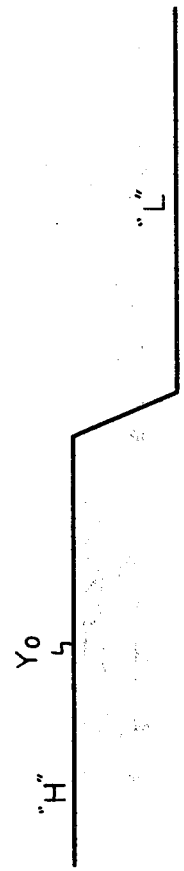
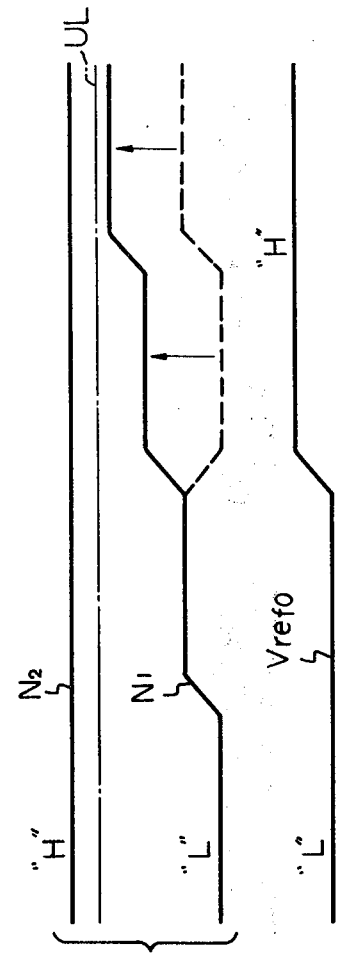
Fig. 4A
Fig. 4B
Fig. 4C
Fig. 4D

STATIC MEMORY CIRCUIT

BACKGROUND OF THE INVENTION

The present invention relates to a static memory circuit incorporating memory cells of a MOS static type.

In general, each of the MOS static memory cells comprises a bi-stable flip-flop which uses four transistors per bit. That is, the memory cell comprises a pair of load resistors, a pair of driver transistors which are cross-coupled to each other, and a pair of transfer gate transistors connected to one word line and one bit line pair. In this memory cell, only one of the driver transistors is turned on to correspond to memory data "0" or "1".

In order to read the cell, the transfer gate transistors are turned on by changing the potential of the word line so that the data on the driver transistors is transferred to the bit lines. Similarly, in order to write data into the cell, the transfer gate transistors are also turned on by changing the potential of the word line and proper voltages are then applied to the bit lines.

One conventional static memory circuit of a MOS static type incorporates a large number of such memory cells arranged along rows and columns which are orthogonal to each other. In addition, the circuit comprises a plurality of word lines each connected to the memory cells belonging to one row, a plurality of pairs of bit lines, each pair connected to the memory cells belonging to one column, and a plurality of pairs of column selection gates each pair connected to one pair of the bit lines. In this case, selection of one cell among the memory cells is effected by selecting one of the word lines and one pair of the bit lines.

However, in the above-mentioned conventional circuit, when one memory cell is selected so as to read the data stored in the cell, transfer gate transistors of other non-selected memory cells belonging to the same word line of the selected cell are also turned on, so that currents flow from a power supply through the non-selected memory cells to another power supply (ground). In this case, such non-selected memory cells which are connected to one selected word line are defined as half-selected memory cells. Therefore, since a large number of such half-selected memory cells are connected to one selected word line, power dissipation therefor is large. In addition, even in non-selected memory cells which are connected to a non-selected word line, in order to maintain the memory data stored in the flip-flops of the non-selected memory cells, appropriate hold currents which are, of course, relatively small must flow therethrough. Therefore, since there are also a large number of such non-selected memory cells in the static memory circuit, power dissipation therefor is large.

It is a summary of the invention object of the present invention to provide a static memory circuit with small power dissipation and without reducing the read speed.

According to the present invention, there is provided a static memory circuit comprising: a first power supply; a second power supply the potential of which is lower than that of the first power supply; a plurality of word lines; a plurality of pairs of bit lines; a plurality of pairs of column selection gate transistors each pair connected to one of the pairs of bit lines and controlled by one of the column selection signals; a plurality of memory cells each comprising a pair of first loads connected to the first power supply, first and second transistors each having a gate connected to one of the first loads and to a drain of the other transistor, and each having a source connected to a source of the other transistor, and third and fourth transistors each having a drain connected to one of the bit lines, each having a source connected to one of the drains of the first and second transistors and each having a gate connected to one of the word lines; and a plurality of means, connected to the sources of the first and second transistors of the memory cells and to the second power supply, for setting the potential of the sources of the first and second transistors of a selected one of the memory cells to be lower than those of non-selected ones of the memory cells.

The present invention will now be more clearly understood from the following description contrasted with the conventional circuit and with reference to the drawings.

BRIEF DESCRIPTION OF THE DRAWINGS

FIGS. 4A through 4D are timing diagrams for explaining the operation of the cell $C_{00}$ of FIG. 3.

DESCRIPTION OF THE PREFERRED EMBODIMENTS

Figure 1:
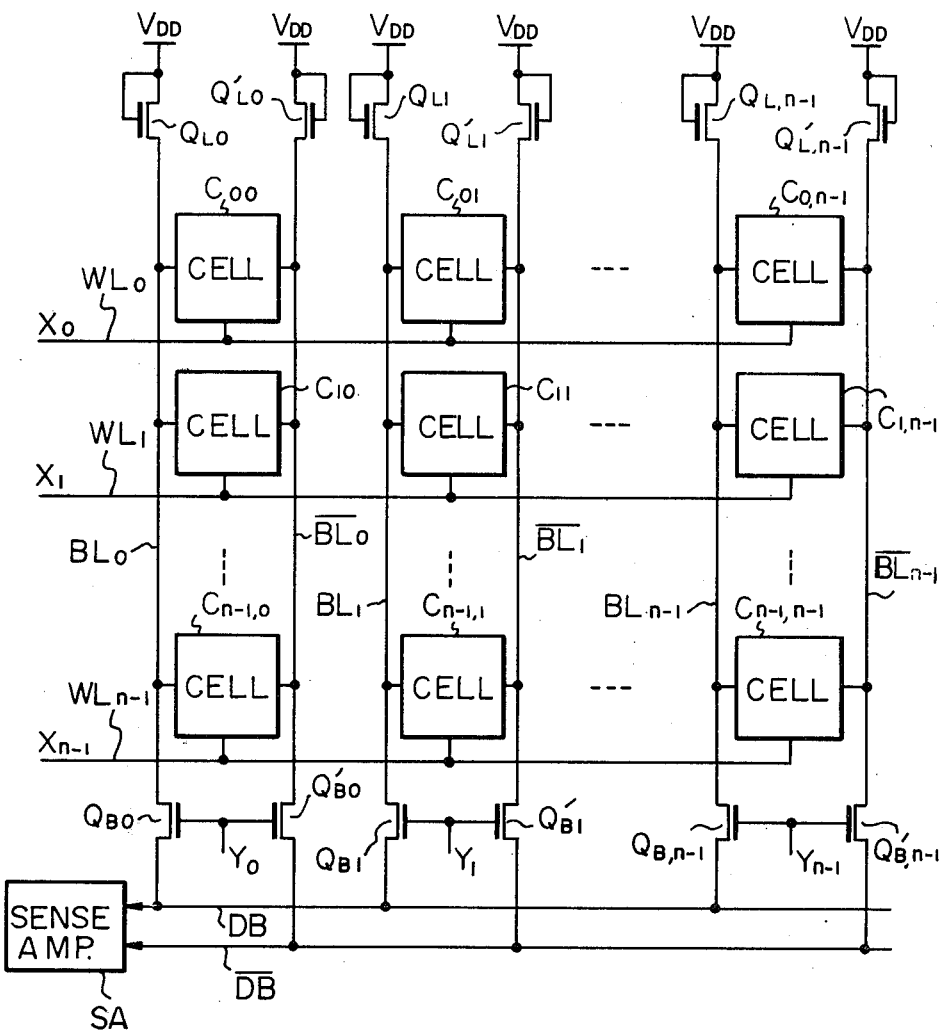
FIG. 1 is a block circuit diagram illustrating one conventional static memory circuit.

Referring to FIG. 1, which illustrates one conventional static memory circuit, the static memory circuit comprises a plurality of memory cells $C_{ij}$ (i, j = 0, 1, ..., n−1) which are arranged in an n row by n column matrix. Each of the memory cells, for example, the memory cell $C_{00}$, is connected to one word line $WL_0$ which is selected by a row address signal $X_0$ and to one pair of bit lines $BL_0$ and $\overline{BL}_0$ which are selected by conducting transistors $Q_{B0}$ and $Q_{B0}'$. In this circuit, the transistors $Q_{B0}$ and $Q_{B0}'$ are column selection gates which are controlled by a column selection signal $Y_0$. In addition, all the bit lines $BL_0$, $\overline{BL}_0$, $BL_1$, $\overline{BL}_1$, ..., $BL_{n-1}$, $\overline{BL}_{n-1}$ are connected to a power supply $V_{DD}$ through load transistors $Q_{L0}$, $Q_{L0}'$, $Q_{L1}$, $Q_{L1}'$, ..., $Q_{L,n-1}$, $Q_{L,n-1}'$, respectively, and to data bus lines DB and $\overline{DB}$ connected to a sense amplifier SA through the transistors $Q_{B0}$, $Q_{B0}'$, $Q_{B1}$, $Q_{B1}'$, ..., $Q_{B,n-1}$, $Q_{B,n-1}'$, respectively.

Figure 2:
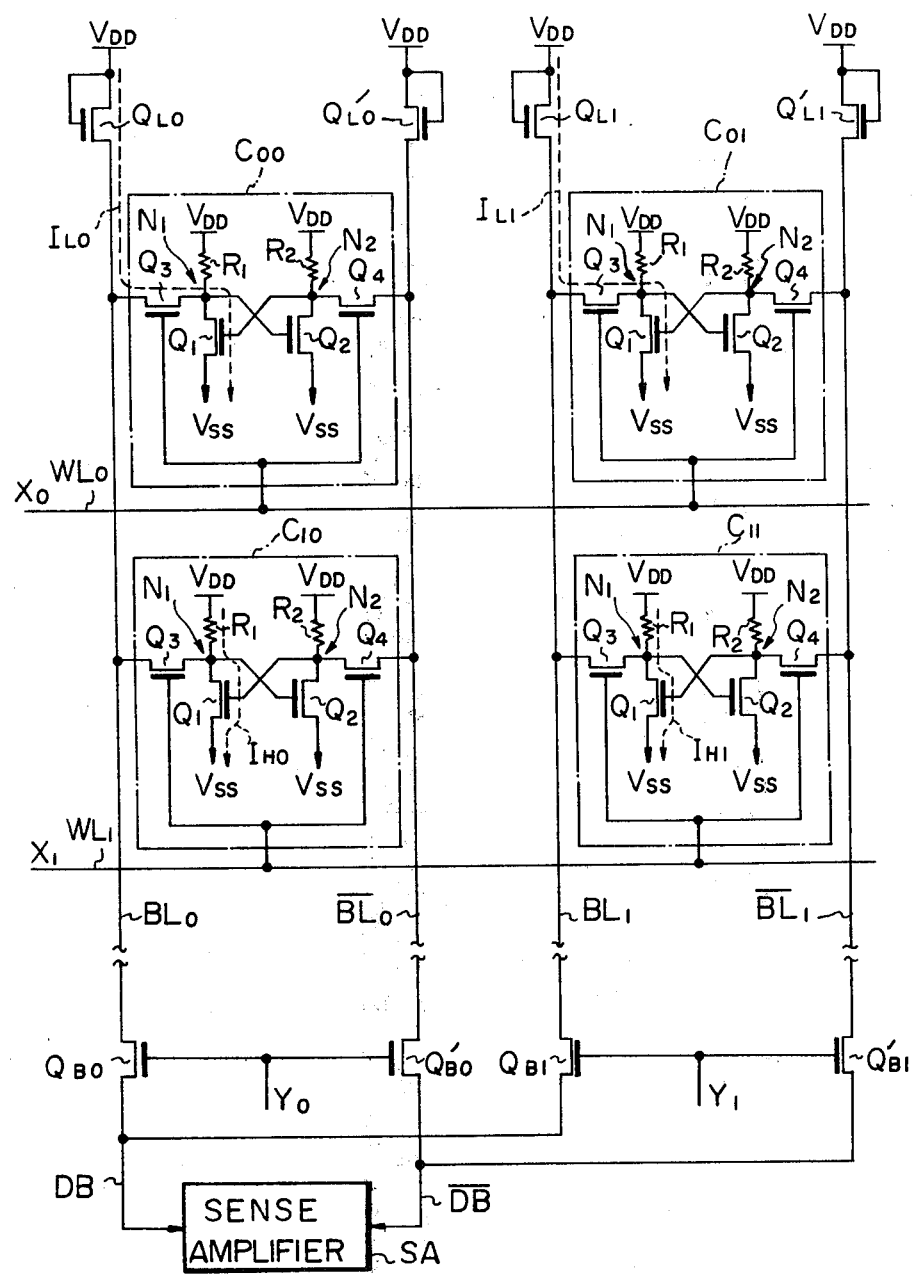
FIG. 2 is a circuit diagram of the memory cells $C_{00}$, $C_{01}$, $C_{10}$ and $C_{11}$ of FIG. 1.

FIG. 2 is a circuit diagram of the memory cells $C_{00}$, $C_{01}$, $C_{10}$ and $C_{11}$ of FIG. 1. In FIG. 2, each of the memory cells, which are, of course, the same as the other memory cells of FIG. 1, comprises a pair of loads $R_1$ and $R_2$, which are resistors, and a pair of transistors $Q_1$ and $Q_2$ cross-coupled to each other, which constitute a flip-flop, and a pair of transfer gate transistors $Q_3$ and $Q_4$. In this case, a drain and a gate of the transistor $Q_1$ are connected to a gate and a drain of the transistor $Q_2$, respectively. In addition, the transfer gate transistors $Q_3$ and $Q_4$ are connected to the bit lines $BL_0$ and $\overline{BL}_0$ (or $BL_1$ and $\overline{BL}_1$), respectively, and the gates of the transistors $Q_3$ and $Q_4$ are connected to the word line $WL_0$ (or WL$_1$), commonly. In FIG. 2, it should be noted that two gate-drain connected transistors can be used as the load resistors R$_1$ and R$_2$.

The read operation of the circuit of FIG. 2 will now be explained. For example, when it is required to read the data stored in the memory cell C$_{00}$, the potential of the row selection signal X$_0$, that is, the potential of the word line WL$_0$ is caused to be high by a row driver (not shown), so that the transfer gate transistors Q$_3$ and Q$_4$ of the cell C$_{00}$ conduct. As a result, the potentials at nodes N$_1$ and N$_2$ of the cell C$_{00}$ which are dependent upon the memory data "0" or "1" are transmitted to the bit lines BL$_0$ and $\overline{BL_0}$, respectively. In this case, if the transistor Q$_1$ is conductive, as illustrated in FIG. 2, a load current I$_{L0}$ flows from a power supply V$_{DD}$, through the transistor Q$_{L0}$ and the transistors Q$_3$ and Q$_1$ of the cell C$_{00}$ to a power supply V$_{SS}$, so that the potential of the bit line BL$_0$ is decreased. On the other hand, in this case, since the transistor Q$_2$ of the cell C$_{00}$ is non-conductive, no current flows through the transistor Q$_{L0}'$, the transistors Q$_4$ and Q$_2$ of the cell C$_{00}$. Thus the potential of the bit line BL$_0$ remains at the same high level which is a lower level than the power supply V$_{DD}$ by the threshold voltage V$_{th}$ of the transistor Q$_{L0}'$. In addition, when the potential of the column selection signal Y$_0$ is caused to be high by a column driver (not shown) so that the transistors Q$_{B0}$ and Q$_{B0}'$ are turned on, the difference in potential between the bit lines BL$_0$ and $\overline{BL_0}$, that is, the difference in potential between data bus lines $\overline{DB}$ and DB, is amplified by the sense amplifier SA.

However, in this state, even in the half-selected memory cell C$_{01}$ connected to the selected high word line WL$_0$ and to the non-conductive transistors Q$_{B1}$ and Q$_{B1}'$, the transfer gate transistors Q$_3$ and Q$_4$ conduct. As a result, a load current I$_{L1}$ as illustrated in FIG. 2 flows from the transistor Q$_{L1}$ and the transistors Q$_3$ and Q$_1$ of the cell C$_{01}$ to the power supply V$_{SS}$, if the potentials at the nodes N$_1$ and N$_2$ of the cell C$_{01}$ are low and high, respectively. In other words, when the potential of one word line is high, the same type of a current flows through each of the half-selected memory cells which belong to the word line.

Further, in each of the non-selected memory cells C$_{10}$ and C$_{11}$, a hold current I$_{H0}$ flows from the power supply V$_{DD}$ through the resistor R$_1$ and the transistor Q$_1$ to the power supply V$_{SS}$, if the potentials at the nodes N$_1$ and N$_2$ thereof are low and high, respectively. Note that such a hold current also flows through both the selected memory cell C$_{00}$ and the half-selected memory cell C$_{01}$; however, the hold current is much smaller than the load current I$_{L0}$ or I$_{L1}$.

Returning to FIG. 1, usually, the static memory circuit is of a large scale, which is, for example, 4,096 or 16,384 bits. Therefore, in the case of a 4,096 bit (64×64) memory circuit, the above-mentioned load current, which is invalid for the read operation, flows through each of (64-1) half-selected memory cells, while, in the case of a 16,384 bit (128×128) memory circuit, such invalid load current flows through each of (128-1) half-selected memory cells, which results in a large power consumption. For example, if the load current is 0.5 mA per cell, the amount of invalid load currents is 31.5 mA (=0.5×63) in the case of the 4,096 bit memory circuit, while the amount is 63.5 mA (0.5×127) in the case of the 16,384 bit memory circuit. Therefore, in high-integrated memory circuits, it is impossible to neglect the amount of invalid load currents. Because of this, it is considered necessary to reduce the value of the load current; however, when this occurs, power for charging the bit lines and the data bus lines DB and $\overline{DB}$ in the read mode is reduced and accordingly, the read speed is reduced. Therefore, usually, the value of the load current is selected to be appropriately high so as to increase the read speed.

It should be noted that in non-selected memory cells, except for half-selected memory cells, hold currents are preferably as small as possible. This is helpful in reducing power consumption, since the number of such non-selected memory cells is much larger than that of half-selected memory cells. However, the hold current has a lower limit and if the hold current is lower than the lower limit, the memory data stored in the cell, that is, the state of the potentials at the nodes N$_1$ and N$_2$ cannot be maintained.

Figure 3:
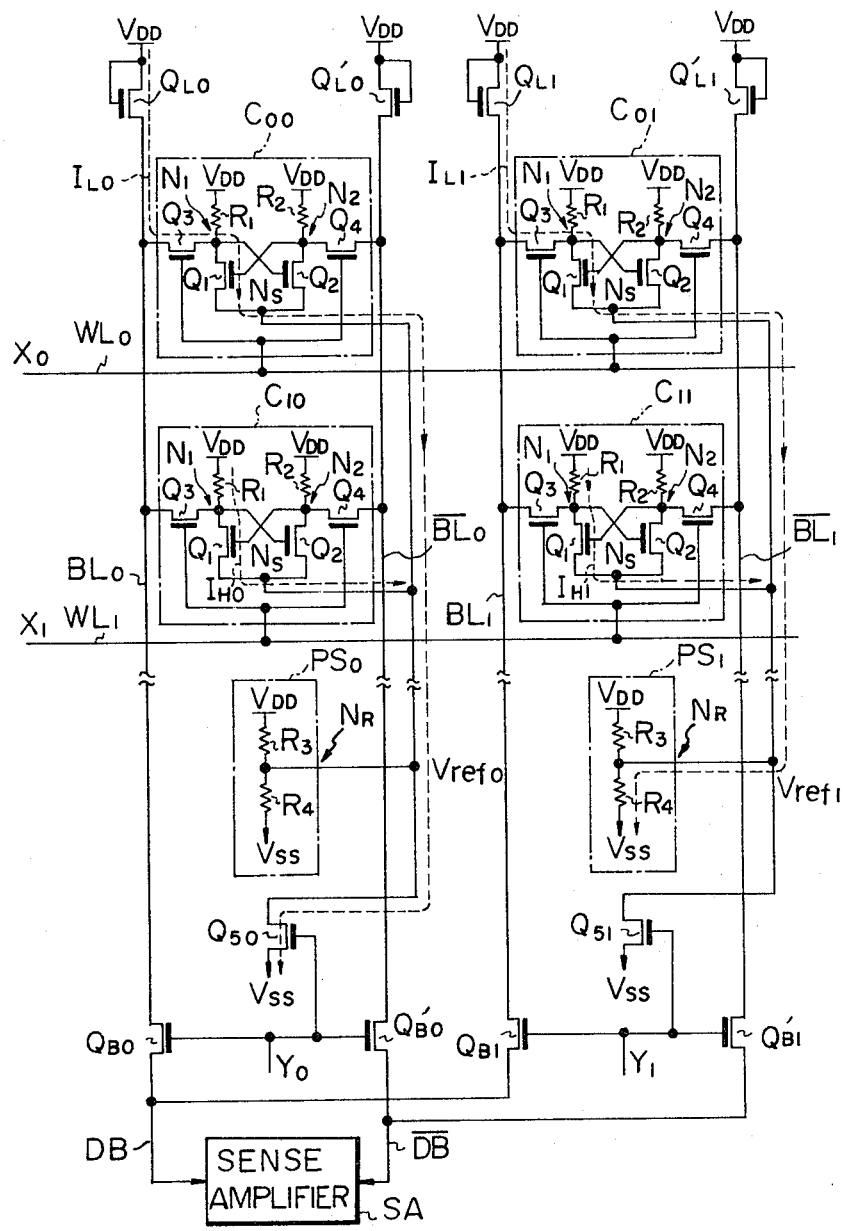
FIG. 3 is a circuit diagram illustrating an embodiment of the static memory circuit according to the present invention.

FIG. 3 is a circuit diagram illustrating an embodiment of the static memory circuit according to the present invention. In FIG. 3, the elements which are the same as those of FIG. 2 are denoted by the same references. In each of the memory cells C$_{00}$, C$_{01}$, C$_{10}$ and C$_{11}$, a common source node N$_S$ of the cross-coupled transistors Q$_1$ and Q$_2$ is not directly connected to the power supply V$_{SS}$. That is, the node N$_S$ is connected to a reference node N$_R$ of a potential setting circuit PS$_0$ or PS$_1$ and to a transistor Q$_{50}$ or Q$_{51}$. Each of the potential setting circuits PS$_0$ and PS$_1$ comprises two resistors R$_3$ and R$_4$ connected in series. In addition, the transistor Q$_{50}$ or Q$_{51}$ has a drain connected to the reference node N$_R$ of the circuit PS$_0$ or PS$_1$, has a source connected to the power supply V$_{SS}$ and has a gate for receiving the column selection signal Y$_0$ or Y$_1$.

The selecting operation of the memory cells is the same as that of FIG. 2. For example, when the potentials of the row selection signals X$_0$ and X$_1$ are high and low, respectively, and simultaneously, the potentials of the column selection signals Y$_0$ and Y$_1$ are high and low, respectively, the memory cells C$_{00}$, C$_{01}$, C$_{10}$ and C$_{11}$ are selected, half-selected, non-selected and non-selected respectively.

In the selected memory cell C$_{00}$, since the transistor Q$_{50}$ is turned on due to the high potential of the column selection signal Y$_0$, the potential V$_{ref0}$, that is, the potential at the node N$_S$ of the cell C$_{00}$ reaches the same level as the power supply V$_{SS}$. If the transistors Q$_1$ and Q$_2$ are conductive and non-conductive, respectively, a load current I$_{L0}$ flows from the power supply V$_{DD}$ through the transistor Q$_{L0}$, the transistors Q$_3$ and Q$_1$ of the cell C$_{00}$ and the transistor Q$_5$ to the power supply V$_{SS}$. At this time, another load current does not flow, since the transistor Q$_2$ of the cell C$_{00}$ is non-conductive. As a result, the potentials of the bit line BL$_0$ and BL$_1$ become low and high, respectively, and accordingly, the difference in potential therebetween is read out from the data bus lines DB and $\overline{DB}$ and it is amplified by the sense amplifier SA. It should be noted that, since the potential at the node N$_S$ is the same as that of the power supply V$_{SS}$, the load current I$_{L0}$ is selected to be 0.5 mA in the same way as FIG. 2, so that the read speed is never reduced.

In the half-selected memory cell C$_{01}$, since the transistor Q$_{51}$ is cut off due to the low potential of the column selection signal Y$_1$, the potential V$_{ref1}$, that is, the potential at the node N$_S$ reaches the same level as the node N$_R$ of the circuit PS$_1$ which is determined by the resistors R$_3$ and R$_4$. Therefore, a load current I$_{L1}$ flows from the power supply V$_{DD}$ and through the transistor Q$_{L1}$, the transistors Q$_3$ and Q$_1$ of the cell C$_{01}$ and the resistor $R_4$ of the circit $PS_1$ to the power supply $V_{SS}$. In this case, since the potential at the node $N_S$ of the cell $C_{01}$ is higher than that of the cell $C_{00}$, the load current $I_{L1}$ in the half-selected cell $C_{01}$ is smaller than the load current $I_{L0}$ in the selected cell $C_{00}$. The load current $I_{L1}$ can be reduced by selecting the values of the resistors $R_3$ and $R_4$; however, the load current $I_{L1}$ should not be so small as to fail to maintain the on- and off-states of the flip-flop of the memory cell $C_{01}$; that is, maintain the memory data. For example, if the power supplies $V_{DD}$ and $V_{SS}$ equal 5 and 0 volts, respectively, and the threshold voltage of the transistors $Q_1$ and $Q_2$ is about 0.7 through 1 volts, the upper limit of the potential at the node $N_R$ is about 3.5 volts. In addition, if the potential at the node $N_R$ equals 2 volts, the load current $I_{L1}$ is reduced to be about 0.15 mA and accordingly, current consumptions $(0.5-0.15)$ mA$\times 63$ and $(0.5-0.15)$ mA$\times 127$ can be saved in a 4,096 bit memory circuit and a 16,384 bit memory circuit, respectively.

In the non-selected memory cells $C_{10}$ and $C_{11}$, hold currents $I_{H0}$ and $I_{H1}$, which are relatively small, flow therethrough. Even in this case, since the potential at the node $N_S$ of the cell $C_{11}$ is higher than that of the cell $C_{10}$, the hold current $I_{H1}$ of the cell $C_{11}$ is smaller than the hold current $I_{H0}$ of the cell $C_{10}$. For example, in a 4,096 bit memory circuit, there are $(64-1)^2$ of non-selected memory cells which correspond to the non-selected cell $C_{11}$. Therefore, the decrease of the hold currents in non-selected cells is helpful to ensure small power consumption.

FIGS. 4A through 4D are timing diagrams for explaining the operation of the cell $C_{00}$ of FIG. 3. Referring to FIGS. 4A and 4B, the memory cell $C_{00}$ has four states indicated by periods I, II, III and IV. In the period I, the potentials of the selection signals $X_0$ and $Y_0$ are low and high, respectively, which means that the cell $C_{00}$ is non-selected. In the period II, the potentials of the selection signals $X_0$ and $Y_0$ are both high, which means that the cell $C_{00}$ is selected. In the period III, the potentials of the selection signals $X_0$ and $Y_0$ are both low, which means that the cell $C_{00}$ is non-selected. Finally, in the period IV, the potentials of the selection signal $X_0$ and $Y_0$ are high and low, which means that the cell $C_{00}$ is half-selected.

Now, it is assumed that the potentials at the nodes $N_1$ and $N_2$ of the cell $C_{00}$ are low and high, respectively. In this case, the high potential at the node $N_2$ remains at the same level independent of the potentials of the signals $X_0$ and $Y_0$, as illustrated in FIG. 4C. Contrary to this, the potential at the node $N_1$ is dependent upon the potentials of the signal $X_0$ and $Y_0$. That is, as illustrated in FIG. 4C, the potential at the node $N_1$ is higher in the case of the high potential of the signal $X_0$ than in the case of the low potential of the signal $X_0$. In addition, the potential at the node $N_1$ is higher in the case of the low potential of the signal $Y_0$ than in the case of the high potential of the signal $Y_0$, since the potential of the reference voltage $V_{ref0}$ is dependent upon the potential of the signal $Y_0$, as illustrated in FIG. 4D. In FIG. 4C, a dotted line indicates the potential at the node $N_1$ in the conventional circuit of FIG. 2. Therefore, in the periods III and IV, the current consumption can be reduced as compared with the conventional circuit. However, it should be noted that the potential at the node $N_1$ should be not higher than an upper level UL, in order to maintain the memory data of the cell $C_{00}$.

Figure 5:
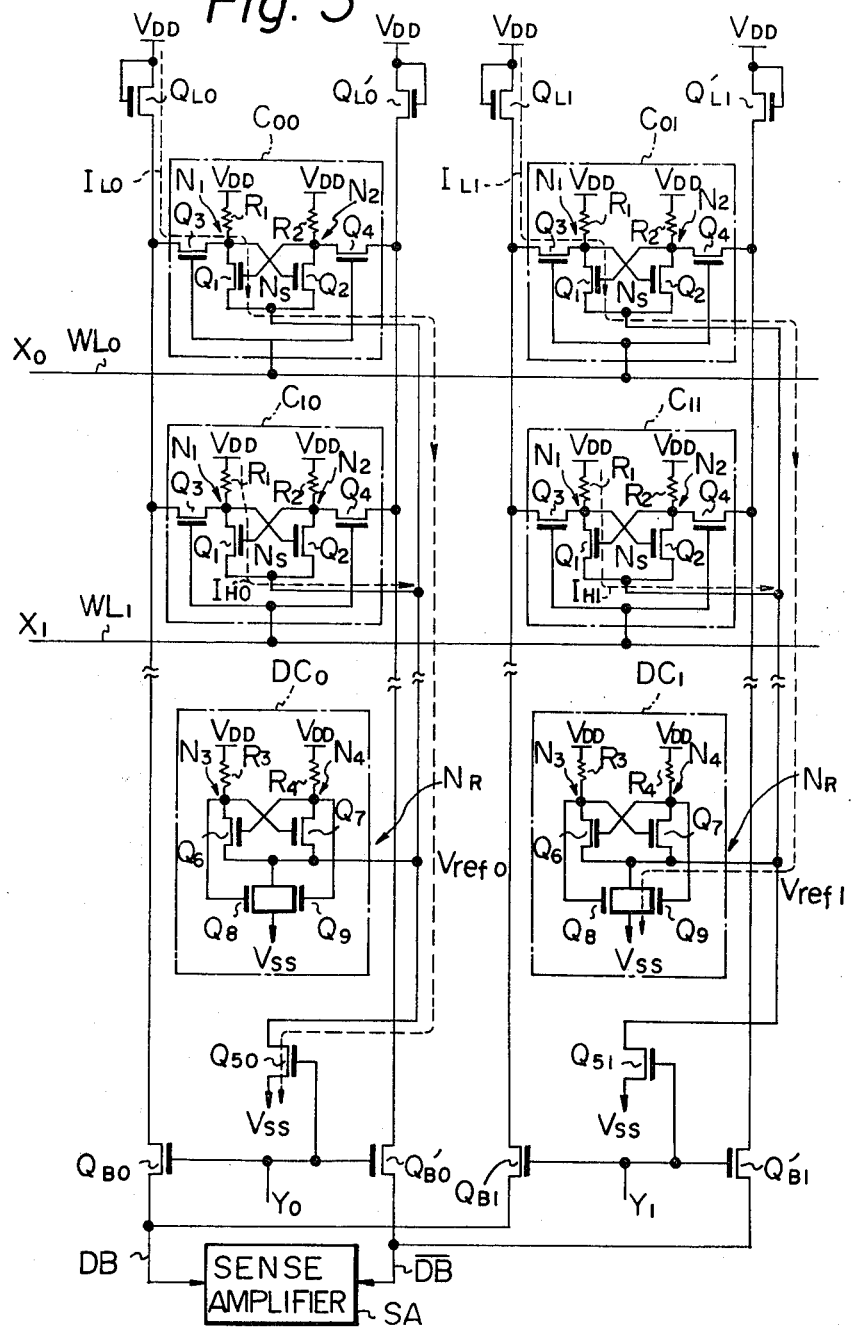
FIG. 5 is a circuit diagram illustrating another embodiment of the static memory circuit according to the present invention.

FIG. 5 is a circuit diagram illustrating another embodiment of the static memory circuit according to the present invention. In FIG. 5, the elements which are the same as those of FIG. 3 are denoted by the same references. In FIG. 5, dummy cells $DC_0$ and $DC_1$ are provided instead of the potential setting circuits $PS_0$ and $PS_1$, respectively, of FIG. 3. The dummy cells $DC_0$ and $DC_1$ are similar to the memory cells. That is, each of the dummy cells $DC_0$ and $DC_1$ comprises a pair of load resistors $R_3$ and $R_4$ and a pair of cross-coupled transistors $Q_6$ and $Q_7$ which constitute a flip-flop. In addition, the dummy cell $DC_0$ (or $DC_1$) comprises a negative feedback circuit formed by transistors $Q_8$ and $Q_9$ connected to the above-mentioned flip-flop at the node $N_R$. In more detail, the transistors $Q_8$ and $Q_9$ are arranged between the common source of the transistors $Q_6$ and $Q_7$ and the power supply $V_{SS}$ and in addition, the transistors $Q_8$ and $Q_9$ are controlled by the complementary potentials at the nodes $N_3$ and $N_4$ of the flip-flop.

The operation of the dummy cells $DC_1$ and $DC_2$ is the same as that of the potential setting circuit $PS_0$ and $PS_1$ of FIG. 3. However, as compared with the embodiment as illustrated in FIG. 3, the embodiment as illustrated in FIG. 5 has an advantage in that the circuit is proof against the fluctuation of the memory operation, since the dummy cell $DC_0$ (or $DC_1$) comprises a flip-flop similar to that of the memory cell, for example $C_{00}$. Therefore, the fluctuation of the potentials at the nodes $N_1$ and $N_2$ of the memory cell $C_{00}$ (or $C_{10}$) due to the fluctuation of the power supply $V_{DD}$ or $V_{SS}$ is detected as the fluctuation of the potentials at the nodes $N_3$ and $N_4$ of the dummy cell $DC_0$. In addition, since the potentials at the nodes $N_3$ and $N_4$ which are outputs of the flip-flop control parallel resistances of the transistors $Q_8$ and $Q_9$, so as to maintain the latch condition of the flip-flop in the dummy cell $DC_0$ (or $DC_1$), the decrease of the potential of the power supply $V_{DD}$ also causes the potentials at the nodes $N_3$ and $N_4$ to be reduced and accordingly, said parallel resistances to be reduced. As a result, the potential at the node $N_R$ is reduced. Contrary to the above, the increase of the potential of the power supply $V_{DD}$ causes the potential at the node $N_R$ to be increased. Thus, since the potential at the node $N_R$ changes responsive to the fluctuation of the potential of the power supply $V_{DD}$, the difference in potential between the power supply $V_{DD}$ and the node $N_R$ can be definite, even if the potential of the power supply $V_{DD}$ is fluctuated. As a result, destruction of the memory data can be avoided and, in addition, currents such as load currents flowing through half-selected cells and hold currents flowing through non-selected cells can be reduced. In FIG. 5, the reference voltage $V_{ref0}$ (or $V_{ref1}$) can be determined by selecting the values of the resistors $R_3$ and $R_4$, the $g_m$ ratio between the transistors $Q_6$ and $Q_7$, and the $g_m$ ratio between the transistors $Q_8$ and $Q_9$.

As explained hereinbefore, the present invention has an advantage, as compared with the conventional circuit, in that current dissipation, that is, power dissipation is reduced, since load currents flowing through half-selected memory cells are reduced and, in addition, hold currents flowing through non-selected memory cells are reduced. In the present invention, the read speed is not decreased, since a load current flowing through a selected memory cell is not reduced.

We claim:

1. A static memory circuit, operatively connectable to receive column selection signals, comprising:
a first power supply;

a second power supply the potential of which is lower than that of said first power supply;
a plurality of word lines;
a plurality of pairs of bit lines;
  a plurality of pairs of column selection gate transistors, each pair operatively connected to one of said plurality of pairs of bit lines and controlled by said column selection signals;
a plurality of memory cells each of which comprises:
  a pair of first loads operatively connected to said first power supply;
  first and second transistors each having a gate operatively connected both to a respective one of said first loads and to a drain of the other transistor of said first and second transistors and each having a source operatively connected to a source of the other transistor of said first and second transistors; and
  third and fourth transistors each having a drain operatively connected to one of the respective bit lines of a respective one of said pairs of bit lines, each having a source operatively connected to a respective one of the drains of said first and second transistors and each having a gate operatively connected to a respective one of said word lines; and
  means, operatively connected to both the source of said first and second transistors of said memory cells and to said second power supply, for setting the potential of the sources of said first and second transistors of a selected one of said plurality of memory cells to be lower than those of non-selected ones of said plurality of memory cells.

2. A circuit as set forth in claim 1, wherein said plurality of memory cells are arranged in columns, wherein said potential setting means comprises:
two resistors operatively connected in series forming a node therebetween, said two resistors being operatively connected between said first and second power supplies, the node between said two resistors being operatively connected to the sources of said first and second transistors of the respective ones of said plurality of memory cells belonging to one column; and
a fifth transistor having a drain operatively connected to the node between said two resistors, having a source operatively connected to said second power supply and having a gate for receiving one of said column selection signals.

3. A circuit as set forth in claim 1, wherein said plurality of memory cells are arranged in columns, and wherein said potential setting means comprises:
a dummy cell having a reference terminal operatively connected to the sources of said first and second transistors of the respective ones of said plurality of memory cells belonging to one column; and
a fifth transistor having a drain operatively connected to said dummy cell, having a source operatively connected to said second power supply and having a gate for receiving one of said column selection signals.

4. A circuit as set forth in claim 3, wherein said dummy cell comprises:
a pair of second loads operatively connected to said first power supply;
sixth and seventh transistors each having a gate operatively connected both to a respective one of said second loads and to a drain of the other transistor of said sixth and seventh transistors and each having a source operatively connected both to a source of the other transistor of said sixth and seventh transistors and to said reference terminal; and
eighth and ninth transistors each having a drain operatively connected to said reference terminal, each having a source operatively connected to said second power supply and each having a gate operatively connected to the respective one of the drains of said sixth and seventh transistors.

5. A static memory circuit, comprising:
word lines arranged in a first direction;
bit line pairs intersecting said word lines and arranged in a second direction;
static memory cells operatively connected to said word lines and said bit line pairs, respectively; and
means, operatively connected to said static memory cells, for setting a source potential applied to said static memory cells and for supplying a predetermined amount of current to said static memory cells of a selected bit line pair and supplying a current smaller than said predetermined amount of current to said static memory cells of non-selected bit line pairs, so that power consumption by said static memory cells of the non-selected bit line pairs is reduced.

6. A static memory circuit as set forth in claim 5, wherein said potential setting means comprises:
a first resistor operatively connected to a first node and having a first reference voltage applied thereto;
a second resistor operatively connected to the first node and having a second reference voltage applied thereto, the respective said static memory cells being operatively connected to the first node; and
a transistor, operatively connected to the first node and having the second reference voltage applied thereto, for connecting the second reference voltage to the first node and said memory cell in dependence upon the selection of the bit line pair.

7. A static memory circuit as set forth in claim 5, wherein said potential setting means comprises:
a dummy memory cell, operatively connected to the respective said static memory cells, for maintaining a stable power supply to said static memory cells; and
a transistor, operatively connected to said dummy memory cell, and the respective said static memory cells and having a first reference voltage applied thereto, for connecting the first reference voltage to said dummy memory cell and the respective said static memory cells in dependence upon the selection of the bit line pair.

8. A static memory circuit as set forth in claim 7, wherein said dummy memory cell comprises:
first and second resistors having a second reference voltage applied thereto;
a flip-flop operatively connected to said first resistor, said second resistor and a first node; and
a negative feedback circuit operatively connected to the first node and having the first reference voltage applied thereto;
wherein the respective said static memory cells and said transistor are operatively connected to the first node.

* * * * *

UNITED STATES PATENT AND TRADEMARK OFFICE
CERTIFICATE OF CORRECTION

PATENT NO. : 4,409,679
DATED      : OCTOBER 11, 1983
INVENTOR(S) : SETSUO KURAFUJI ET AL.

It is certified that error appears in the above-identified patent and that said Letters Patent is hereby corrected as shown below:

FRONT PAGE [56] OTHER PUBLICATIONS
line 2, "Ohzowe" should be --Ohzone--.

Col. 1, between lines 56 and 57, insert the heading --SUMMARY OF THE INVENTION--;
line 57, "a summary of the invention" should be --an--.

Col. 2, line 39, "j-0, 1, . . ." should be --j=0, 1, . . .,--;
line 40, delete ",".

Col. 3, line 29, "$\overline{D}B$" should be --$\overline{DB}$--;
line 30, "DB" should be --$\overline{DB}$--.

Col. 5, line 1, "circit" should be --circuit--.

Col. 7, line 26, "source" should be --sources--.

Signed and Sealed this

Fifth Day of March 1985

[SEAL]

Attest:

DONALD J. QUIGG

Attesting Officer    Acting Commissioner of Patents and Trademarks